United States Patent
Munro et al.

(10) Patent No.: US 7,989,366 B2
(45) Date of Patent: Aug. 2, 2011

(54) DOPANT ACTIVATION IN DOPED SEMICONDUCTOR SUBSTRATES

(75) Inventors: Jeffrey C. Munro, Santa Clara, CA (US); Srinivas D. Nemani, Sunnyvale, CA (US); Young S. Lee, San Jose, CA (US); Marlon Menezes, Mountain View, CA (US); Christopher Dennis Bencher, San Jose, CA (US); Vijay Parihar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 310 days.

(21) Appl. No.: 11/844,810

(22) Filed: Aug. 24, 2007

(65) Prior Publication Data

US 2008/0057740 A1   Mar. 6, 2008

Related U.S. Application Data

(60) Provisional application No. 60/824,229, filed on Aug. 31, 2006.

(51) Int. Cl.
*H01L 21/00* (2006.01)

(52) U.S. Cl. ........ 438/795; 438/142; 438/162; 438/308; 438/478; 438/510; 438/584; 438/780; 438/781

(58) Field of Classification Search .................. 438/530, 438/550, 142, 162, 308, 478, 510, 584, 780, 438/781, 795

See application file for complete search history.

(56) References Cited

U.S. PATENT DOCUMENTS

| | | | |
|---|---|---|---|
| 2005/0074956 A1* | 4/2005 | Autryve et al. | 438/530 |
| 2006/0081558 A1* | 4/2006 | Collins et al. | 216/67 |
| 2006/0113038 A1* | 6/2006 | Gondhalekar et al. | 156/345.33 |
| 2006/0133004 A1* | 6/2006 | Yamamura | 361/234 |
| 2006/0156979 A1* | 7/2006 | Thakur et al. | 118/715 |

* cited by examiner

*Primary Examiner* — Ha Tran T Nguyen
*Assistant Examiner* — Suberr Chi
(74) *Attorney, Agent, or Firm* — Kilpatrick Townsend & Stockton LLP (57) ABSTRACT

Methods are disclosed for activating dopants in a doped semiconductor substrate. A carbon precursor is flowed into a substrate processing chamber within which the doped semiconductor substrate is disposed. A plasma is formed from the carbon precursor in the substrate processing chamber. A carbon film is deposited over the substrate with the plasma. A temperature of the substrate is maintained while depositing the carbon film less than 500° C. The deposited carbon film is exposed to electromagnetic radiation for a period less than 10 ms, and has an extinction coefficient greater than 0.3 at a wavelength comprised by the electromagnetic radiation.

24 Claims, 8 Drawing Sheets

DOPANT ACTIVATION IN DOPED SEMICONDUCTOR SUBSTRATES

CROSS REFERENCE TO RELATED APPLICATION

This application is a nonprovisional of, and claims the benefit of the filing date of, U.S. Prov. Pat. Appl. No. 60/824,229, entitled "DOPANT ACTIVATION IN DOPED SEMICONDUCTOR SUBSTRATES," filed Aug. 31, 2006 by Jeffrey C. Munro, the entire disclosure of which is incorporated herein by reference for all purposes.

This application is also related to U.S. Prov. Pat. Appl. No. 60/824,225, entitled "PLASMA DEPOSITION OF ABSORBER CARBON FILMS," filed Aug. 31, 2006 by Jeffrey C. Munro, the entire disclosure of which is also incorporated herein by reference for all purposes.

BACKGROUND OF THE INVENTION

Two factors that drive much of the development of electronic devices are the desire to increase the density of devices on a substrate and to increase the speed of such devices by reducing their response time. Both these factors are related to the overall performance of products that use electronic devices. An increase in the device density not only permits increased miniaturization of such products, but permits the deployment of a greater number of devices; this, in turn, permits greater versatility or functionality to be implemented with the devices. Increasing the speed of the individual devices also permits the functionality to be enhanced by permitting the execution of a greater number of instructions within any defined time period.

There are a number of approaches that have been investigated to improve both these factors. One technique for increasing the speed of devices may be understood with reference to FIG. 1, which provides a schematic illustration of the structure of a typical transistor 100. The device 100 includes source 104 and drain 108 regions within a semiconducting substrate 116. A material that is commonly used for the substrate 116 is silicon. Application of a voltage to a gate 112 permits current to flow between the source 104 and drain 108 through a junction 120. The speed of such a device may be increased by including and activating suitable dopants that act to increase the conductivity of the junction 120. For example, boron and arsenic are known to increase the conductivity of silicon when the structure is annealed to promote bonding of those dopants with neighboring silicon atoms. The annealing causes a rearrangement of the dopant electron structure that results in an improvement in conduction, and is sometimes referred to in the art as an "activation" step.

Figure 1:
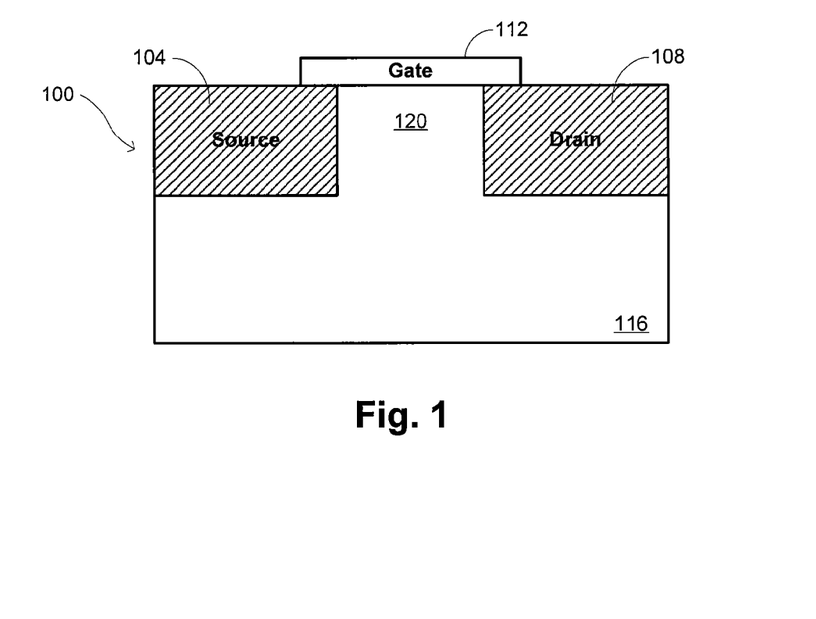
FIG. 1 is a schematic cross-sectional drawing showing a typical structure for a transistor.

Activation is conventionally performed thermally by raising the temperature of the entire substrate. The effectiveness of the activation in promoting conduction is generally proportional to the temperature that is achieved, so that it is preferable to raise the temperature of the substrate to be close to its melting point. The melting point of silicon is 1410° C., so when activation is achieved with a thermal anneal, it is desirable to raise the temperature of the substrate to about 1300-1350° C. But at these temperatures, the diffusivity of the atoms in the substrate is also increased. While a thermal anneal may thus achieve the desired dopant activation, such an anneal also tends to raise the temperature of the substrate for relatively long periods of time. This reduces the level of control that may be exercised over the size and shape of the junction 120.

Both the ability to increase the conductivity of the junction and the ability to control its size and shape are desirable. There is accordingly a general need in the art for methods of activating dopants while retaining control over the size and shape of device junctions.

BRIEF SUMMARY OF THE INVENTION

Embodiments of the invention provide methods of activating dopants in a doped semiconductor substrate. In a first set of embodiments, a carbon precursor is flowed into a substrate processing chamber within which the doped semiconductor substrate is disposed. A plasma is formed from the carbon precursor in the substrate processing chamber. A carbon film is deposited over the substrate with the plasma. A temperature of the substrate is maintained while depositing the carbon film less than 500° C. The deposited carbon film is exposed to electromagnetic radiation for a period less than 10 ms, and has an extinction coefficient greater than 0.3 at a wavelength comprised by the electromagnetic radiation.

The electromagnetic radiation may be substantially monochromatic. Alternatively, the electromagnetic radiation may comprise a band of wavelengths, with the extinction coefficient of the carbon film being greater than 0.3 at each wavelength within the band of wavelengths. An entirety of a surface of the deposited carbon film may be globally exposed to the electromagnetic radiation simultaneously. In other instances, a beam of the electromagnetic radiation is shaped, with the shape being rastered over a surface of the deposited carbon film to cover substantially an entirety of the surface. In some embodiments, the deposited carbon film is removed from the substrate, such as by exposing the substrate to an oxygen plasma.

The carbon precursor may comprise a hydrocarbon precursor, with the deposited carbon film including hydrogen. In some embodiments, a nitrogen precursor is also flowed into the substrate processing chamber with the carbon precursor. The plasma is then formed from the carbon precursor and from the nitrogen precursor, with the deposited film including nitrogen. In other embodiments, a gas comprising oxygen is flowed into the substrate processing chamber with the carbon precursor. A carrier gas may also be flowed into the substrate processing chamber in some embodiments. Examples of suitable carrier gases include argon and molecular nitrogen. The flow of the carrier gas may vary over time. For instance, the carrier gas may initially be flowed at a flow rate less then a steady-state flow rate and increased to the steady-state flow rate after a portion of the carbon film has been deposited over the substrate.

In some embodiments, the temperature of the substrate while depositing the carbon film is less than 400° C. Techniques for maintaining a temperature of the substrate include flowing a coolant proximate a backside of the substrate within the substrate processing chamber.

In a second set of embodiments, a carbon precursor is also flowed into a substrate processing chamber within which the doped semiconductor substrate is disposed. A high-density plasma is formed from the carbon precursor in the substrate processing chamber. The high-density plasma has a density greater than $10^{11}$ ions/cm$^3$. An electrical bias is applied to the substrate. A carbon film is deposited over the substrate with the high-density plasma using a process that provides simultaneous deposition and sputtering components. The deposited carbon film is exposed to electromagnetic radiation for a period less than 10 ms, and has an extinction coefficient greater than 0.3 at a wavelength comprised by the electromagnetic radiation.

A number of specific embodiments have features corresponding to variations among the first set of embodiments described above. In addition, there may be embodiments in which the electrical bias is applied as a substantially constant electrical bias while depositing the carbon film over the substrate. There may also be embodiments in which the electrical bias varies while depositing the carbon film. For instance, in one embodiment, an initial electrical bias is applied to the substrate during an initial phase of depositing the carbon film over the substrate; the initial bias is less than a steady-state bias. The electrical bias is increased from the initial electrical bias to a maximum electrical bias that exceeds the steady-state bias. The electrical bias is then decreased from the maximum electrical bias to the steady-state bias before a temperature of the substrate increases to greater than 500° C.

A further understanding of the nature and advantages of the present invention may be realized by reference to the remaining portions of the specification and the drawings.

DETAILED DESCRIPTION OF THE INVENTION

Figure 2:
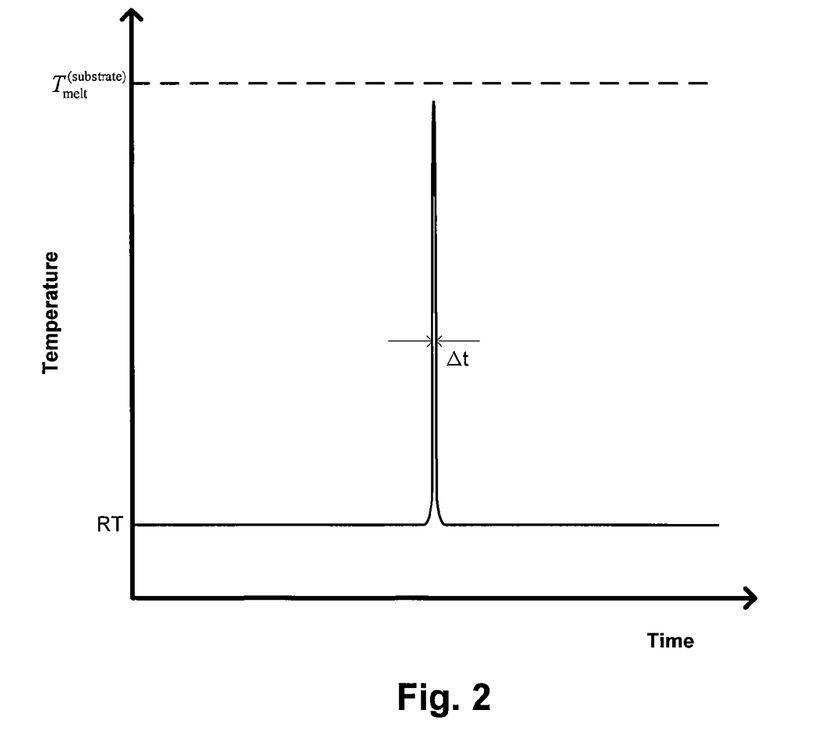
FIG. 2 is a graph of the temperature behavior a spike anneal used in certain embodiments of the invention.

Embodiments of the invention make use of electromagnetic mechanisms for annealing a substrate. These types of mechanisms permit exposure to electromagnetic radiation to be used to raise temperatures over very short time periods, often on the order of milliseconds. The resulting temperature characteristics are illustrated schematically in FIG. 2, which shows that over short time period Δt, the temperature increases sharply to a value somewhat below the melting temperature of the substrate $T_{melt}^{(substrate)}$. For instance, when the substrate is silicon, the dashed line in FIG. 2 may correspond to a temperature of 1410° C., with the temperature during the anneal rising very briefly to a value on the order of 1300-1350° C. Because of the shape of the temperature behavior, such an electromagnetic mechanism for annealing is sometimes referred to as a "spike anneal." The intensity of the electromagnetic radiation is generally correlated with the peak temperature that is achieved and may be adjusted to achieve the desired temperature for annealing The time over which the temperature remains substantially at the peak temperature is sometimes referred to as the "dwell time" for the anneal and may be controlled in a number of different ways depending on how the electromagnetic radiation is applied to the substrate. For instance, in certain embodiments, the electromagnetic radiation is optically shaped by a suitable arrangement of lenses, mirrors, and/or the like, and rastered across the substrate. In such embodiments, the rastering speed is used to control the dwell time, with raster speeds sometimes being in the range of about 20 mm/s to about 300 mm/s Embodiments that use this type of shaping for the exposing radiation typically use a source of substantially monochromatic light, although broadband light sources may be used in alternative embodiments. For example, one embodiment uses a 40-kW laser to provide light at about 810 nm that is shaped into a slit having dimensions of about 1 mm×12 mm.

In other embodiments, the electromagnetic radiation is applied in a substantially uniform manner to the substrate as a whole. By activating the electromagnetic source for a brief period of time, a spike anneal may be achieved since it is not necessary to raise the environmental temperature in which the substrate is disposed to near the substrate melting point. In this class of embodiments, the electromagnetic radiation is typically provided with a broadband source, although alternative embodiments may use narrowband or substantially monochromatic sources. In such embodiments, the substrate is illuminated by one or more "arc lamps" or "flash lamps" that are disposed within the substrate processing chamber and configured to provide a coordinated illumination of the substrate over a short time period at the desired intensity.

Irrespective of the precise mechanism of providing the electromagnetic radiation, i.e. whether it is monochromatic or broadband, or whether it is provided locally or globally to the substrate, the effectiveness of the anneal may be affected by variations in reflectivity over the substrate. In particular, even relatively modest variations in thickness and composition of a substrate, which are common in commercially available substrates, may translate into substantial differences in reflectivity at different points on the substrate. This is relevant when electromagnetic radiation is incident on the substrate surface because the efficiency of coupling energy from the radiation into the substrate depends on the reflectivity. Local variations in the reflectivity translate into variations in the temperatures that are achieved locally in effecting the anneal. Since different device structures may be fabricated at different positions across a given substrate, these temperature variations in turn result in inconsistent device performance that is undesirable.

Embodiments of the invention thus use a carbon film that is present over the substrate during the electromagnetic anneal to improve the uniformity of the anneal. The carbon film acts as a black body that efficiently, and substantially uniformly, couples energy from electromagnetic exposure of the substrate to provide a consistent peak temperature during the spike anneal. Since the carbon film does not generally play a role in fabrication of the devices, it may be removed after performing the anneal. To have effective absorption of electromagnetic radiation, it is preferable that the extinction coefficient of the carbon film be greater than 0.3, and in some embodiments, the extinction coefficient is greater than 0.5. The extinction coefficient provides a general measure of the degree to which electromagnetic waves are damped within a material. While the extinction coefficient is generally dependent on wavelength of the radiation, embodiments of the invention provide carbon films that have an extinction coefficient that is greater than 0.3 at the wavelengths of interest: in cases where monochromatic radiation is to be used, the extinction coefficient exceeds 0.3 at the wavelength of the radiation, and in cases where broadband radiation is to be used, the extinction coefficient exceeds 0.3 across the complete band.

Figure 3:
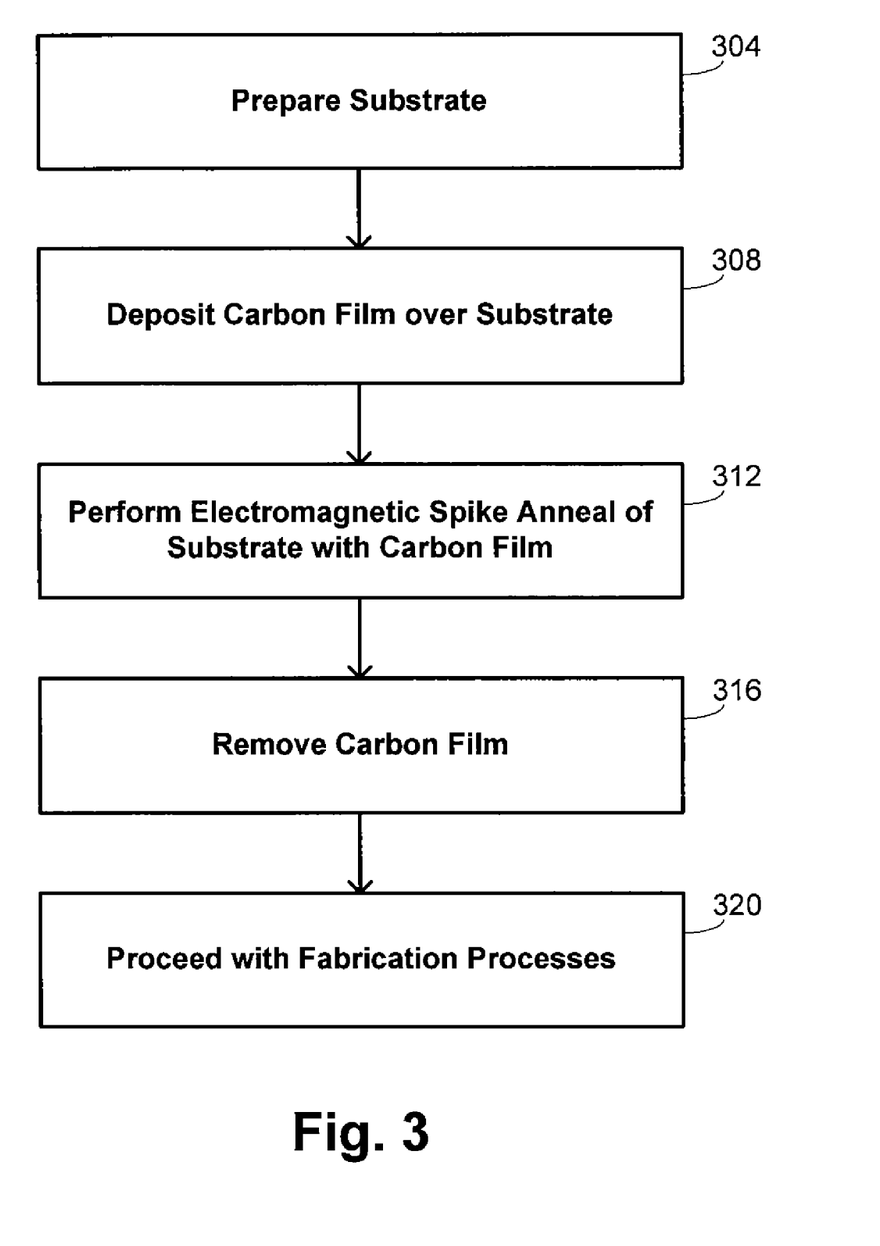
FIG. 3 is a flow diagram that provides an overview of methods for fabricating microelectronic devices on a substrate in embodiments of the invention.

A general overview of processes for fabricating devices on a substrate is thus provided with the flow diagram of FIG. 3. This diagram indicates that the process may begin generally at block 304 with preparation of the substrate. Such preparation may take a variety of different forms, including forming certain features over the substrate with some initial deposition and/or etching processes. Preparation of the substrate commonly includes subjecting the substrate to ion-implantation processes to implant dopants that are subsequently to be activated with the spike anneal. The carbon film is deposited over the substrate at block 308. Some concerns that are common with deposition processes may be relaxed with deposition of the carbon film since it is not intended to form a component of the final device structures. This includes relaxing the strictness of constraints for uniformity of thickness of the carbon film and the like. Certain other processing constraints remain, however, one being the imposition of a thermal budget that affects how the deposition may proceed.

After deposition of the carbon film at block 308, the electromagnetic spike anneal is performed at block 312. As previously noted, this may be performed using substantially monochromatic, narrowband, or broadband electromagnetic radiation in different embodiments, and may be performed in a local or global fashion in different embodiments. When performed locally, the radiation is shaped and rastered across the substrate and, when performed globally, substantially the entire carbonized surface of the substrate is exposed at the same time.

The carbon film is then removed at block 316. There are a number of different techniques that may be used to remove the carbon film in different embodiments. One suitable technique is through application of an oxygen plasma ash, which is both effective at removing the carbon film and unlikely to damage the underlying substrate. Considerations that may impact implementing a film-removal process at block 316 include a general need to avoid implanting carbon from the film into the substrate, although in some specialized applications the process may be modified to achieve such implantation. Carbon implantation may generally be avoided by ensuring that the removal process minimizes the level of residue left on the substrate and by avoiding excessively high electrical biasing of the substrate during the deposition process, which would then drive carbon into the substrate.

After the carbon film has been removed, the remainder of the fabrication processes may be completed on the substrate, as indicated at block 320.

Figure 4:
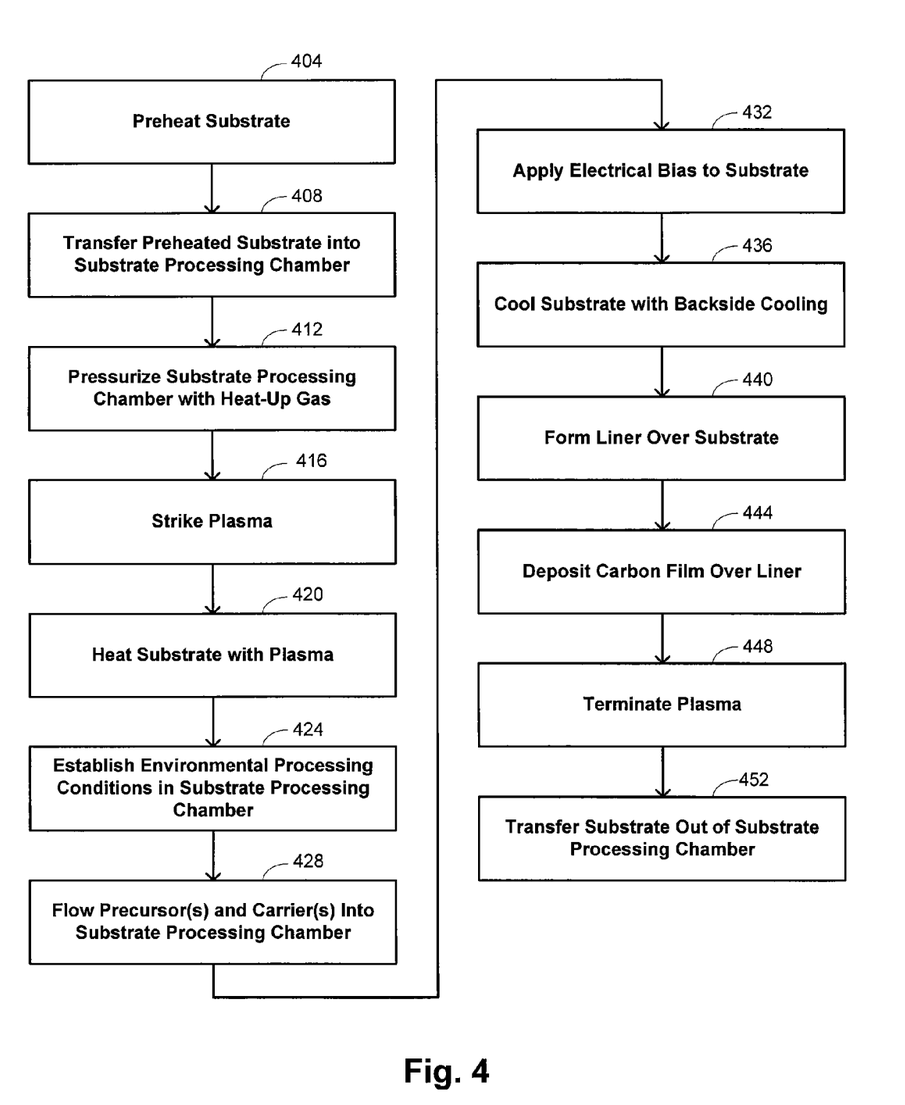
FIG. 4 is a flow diagram summarizing methods of depositing an absorber carbon film over a substrate in embodiments of the invention.

A more detailed description of a method for depositing the carbon film is provided in connection with FIG. 4, which is a flow diagram that corresponds generally to block 312 of FIG. 3. In the illustration, a number of steps are indicated in an exemplary process, but a number of variations on this process are intended to be within the scope of the invention. For example, certain additional steps may sometimes be performed that are not explicitly indicated in the drawings, some steps that are indicated may sometimes be omitted, and the ordering of the steps may sometimes be changed.

The thermal budget that is to be accommodated by the process of FIG. 4 arises from the behavior of dopants in the substrate as the temperature of the substrate increases. After dopant implantation, the distribution of dopants within the substrate is approximately uniform. It is generally desirable to maintain this approximately uniform distribution when the dopants are activated and bound to silicon in the substrate. But when the temperature of the substrate increases to above about 500° C., thermal migration of the dopants results, with some clustering of dopants occurring and their distribution within the substrate becoming less uniform. When the spike anneal is performed at block 316 of FIG. 3, it is performed over so short a time that the dopants bond with silicon where they are located at the time. In order to achieve an approximately uniform distribution of the activated dopants, it is thus desirable to maintain the substrate at a temperature less than 500° C. before the spike anneal is performed at block 316 of FIG. 3. Certain aspects of the process illustrated in FIG. 4 permit accommodating such a thermal budget during deposition of the carbon film.

The process generally begins at block 408 by transferring the substrate into the substrate processing chamber. But in some instances, the substrate is preheated at block 404 before such transfer; the role of such preheating is described below. Once inside the substrate processing chamber, the chamber is pressurized with a heat-up gas at block 412 and a plasma is struck from the heat-up gas at block 416 that is used to heat the substrate at block 420. This heat-up phase of the process is used to raise the temperature of the substrate high enough that subsequent deposition processes may be accomplished effectively without exceeding the thermal budget that exists. The heat-up gas is generally a gas that is not reactive with the substrate, and may comprise an inert gas like He, Ne, or Ar in different embodiments. Other suitable heat-up gases that may be used in different embodiments include $H_2$ and $N_2$, among others.

The inventors have discovered that the heat-up phase of the process may result in a decrease in conductivity of the substrate, particularly in instances where the heat-up gas comprises He. Such a decrease in conductivity is counter to the general objective of increasing the conductivity of device junctions, so that it is preferable to minimize the heat-up time. Preheating of the substrate outside the processing chamber at block 404 is one technique that may be used to minimize exposure to the heating plasma at block 420. Merely by way of example, such preheating is achieved in one embodiment by exposing the substrate to a lamp in a load lock prior to transferring the substrate into the processing chamber. Other techniques for achieving initial heat up of the substrate include the use of a heated electrostatic chuck that maintains a position for the substrate within the processing chamber. Application of resistively generated heat through the chuck to the substrate may avoid adverse effects on conductivity that result from a purely plasma heat up.

It is hypothesized that effect on conductivity from exposure to the heat-up plasma is caused by emission radiation from the heat-up gas. When that gas is heated, it naturally emits electromagnetic radiation at wavelengths characteristic of its electronic structure. From the investigations performed by the inventors, it appears that the conductivity of the substrate is especially susceptible to exposure to electromagnetic radiation at the emission wavelengths of He. Accordingly, certain embodiments make use of $N_2$ or Ar as the heat-up gas.

Once the substrate has been adequately heated, whether that is achieved entirely through exposure to a heat-up plasma or through a combination of preheating and plasma heating, environmental conditions are established within the processing chamber that are suitable for deposition of the carbon film at block 424. Generally, such environmental conditions include a temperature between about 300° C. and about 500° C., with the temperature sometimes being below 400° C. to ensure compliance with a more severe thermal budget. The pressure within the substrate processing chamber may be between about 5 mtorr and about 50 mtorr, although variations from this range may sometimes be made as described below.

One or more precursors are flowed into the substrate processing chamber at block 428, perhaps with a carrier gas. A plasma is formed from the precursors and carrier gas. This may be done by having maintained the heat-up plasma and altering the flow to the processing chamber, or may be done by terminating the heat-up plasma prior to flowing the precursors and striking a second plasma. In either case, the plasma may sometimes comprise a high-density plasma, which refers herein to a plasma having a density greater than $10^{11}$ ions/cm$^3$. One characteristic of high-density plasmas is that they have sufficient density that material is mechanically sputtered from the substrate simultaneous with material being deposited from the plasma onto the substrate. Embodiments that use high-density plasmas may more easily accommodate the thermal budget, but certain embodiments may make use of more conventional plasma-enhanced deposition processes that use lower plasma densities.

There are also different techniques that may be used to form plasmas, including the use capacitive-coupling and inductive-coupling mechanisms. Inductive coupling results in a higher ion density in the plasma than does capacitive coupling and is usually used in the formation of high-density plasmas. Effective deposition of a carbon film may be achieved in certain embodiments with an inductively coupled plasma formed with 1000-8000 W of source power.

The precursor(s) flowed into the substrate processing chamber at block 428 include a carbon-containing precursor, which may take the form of a gas or of a vaporized liquid in different embodiments. The carbon-containing precursor may comprise a hydrocarbon precursor, examples of which include alkanes such as $CH_4$, $C_2H_6$, $C_3H_8$, etc.; alkenes, examples of which include $C_2H_4$, $C_3H_6$, $C_4H_8$, etc.; alkynes, examples of which include $C_2H_2$, $C_3H_4$, $C_4H_6$, etc; aromatics, examples of which include $C_6H_6$, $C_8H_6$, $C_8H_8$, etc. While the foregoing examples of hydrocarbon precursors are examples of precursors that consist of carbon and hydrogen, other compounds may be used that incorporate additional elements such as nitrogen in different embodiments. Suitable flow rates of the precursor(s) at block 428 may be between 50 and 1000 sccm in some embodiments.

The use of different hydrocarbon precursors may result in different levels of hydrogen being incorporated into the deposited carbon film. For example, the use of a hydrocarbon precursor that has double or triple bonds will generally provide a lower density of hydrogen in the plasma, and consequently a lower concentration of incorporated hydrogen in the carbon film, that will use of a purely single-bond hydrocarbon precursor. Recognizing that hydrogen incorporation results from the use of hydrocarbon precursors, use of the term "carbon film" is intended herein to include films that may have a significant non-carbon component to their composition, and particularly to include films that incorporate significant levels of hydrogen. In addition, it is noted that the form in which the carbon bonds may differ in different portions of the film. While the film is likely to be mostly in the form of amorphous carbon, portions or regions may exist that are pyrolytic, graphitic, or diamondlike. Because the film is generally dominated by amorphous carbon, however, it is sometimes referred to in the art as an "amorphous carbon" film; such terminology is not intended to imply that the film is 100% amorphous or 100% carbon.

In addition to incorporating further elements into the film through the use of carbon precursors that include those elements, additional precursor flows may sometimes be provided to the processing chamber. For instance, in certain embodiments, nitrogen is incorporated into the film by including a flow of $N_2$ or $NH_3$. This has the effect of increasing the extinction coefficient, which may be desirable to improve the efficiency of the electromagnetic spike anneal, but makes the film more susceptible to peeling.

Flows of other gases may also be provided to the substrate processing chamber at block 428 even if they do not provide elements that are incorporated into the carbon film. Such additional flows may instead provide elements that react with other plasma elements in controlling aspects of how the carbon film is formed. For example, a flow of molecular oxygen $O_2$ may provide oxygen atoms that react with carbon atoms in the film that are bound only weakly. While such a process does not incorporate oxygen into the film, the carbon film is denser and has a higher extinction coefficient because of the higher density.

When a carrier is included at block 428, it may be the same gas that was used as the heat-up gas at block 412 or may be a different gas. In some instances, the composition of the carrier may be changed during the deposition process. For example, while the adverse effects of He on substrate conductivity may be evident during early stages of the deposition, this is mitigated after deposition of at least some of the carbon film because the substrate is no longer directly exposed to emission radiation from the helium. In some embodiments, a transition may accordingly be made to helium as a carrier gas after an initial part of the deposition proceeds using a different carrier gas, such as Ar. In any event, the use of helium as a carrier during deposition is believed by the inventors to be less detrimental than during the heat-up because of the protective effect provided by partial deposition of the carbon film. A suitable flow rate for the carrier is between 0 and 1000 sccm.

Figure 5:
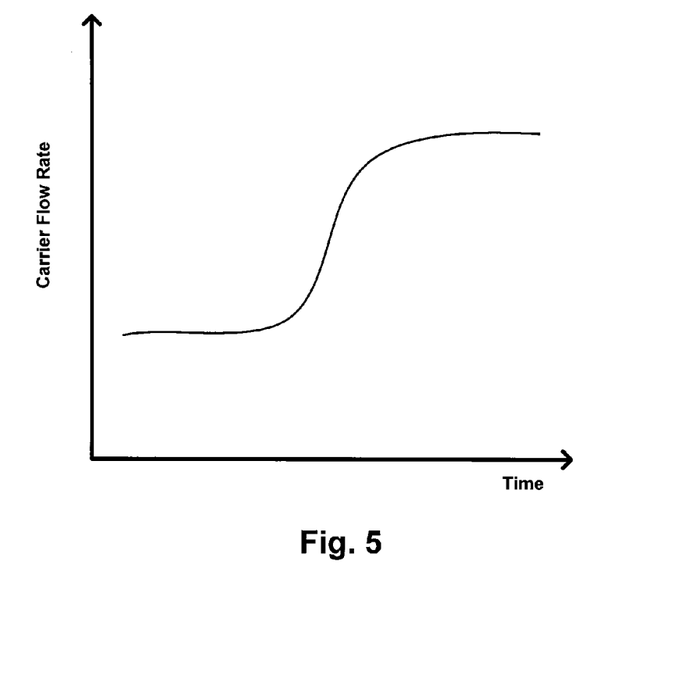
FIG. 5 is a schematic graph of the time behavior of the flow rate of a carrier provided to a substrate processing chamber with a precursor during the methods of FIG. 4 in certain embodiments.

The inventors have also found that variation in the flow rate of the carrier case over the duration of the deposition may be helpful in stabilizing the film. This is illustrated in FIG. 5, in which the flow rate of the carrier gas begins at a relatively low level and is increased partway through the deposition to its steady-state flow rate. The initial flow rate is lower than the steady-state flow rate and greater than about 50% of the steady-state flow rate.

Figure 6A:
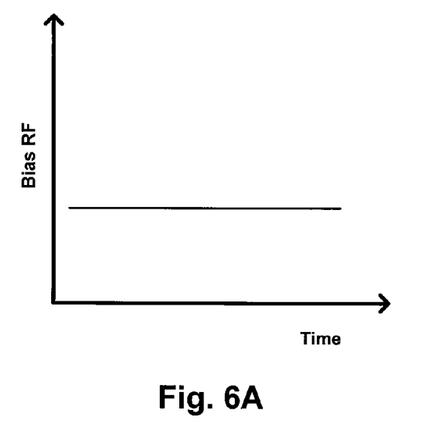
FIGS. 6A and 6B are schematic graphs of the time behavior of an electrical bias that may be applied to a substrate during the methods of FIG. 4 in certain embodiments.
Figure 6B:
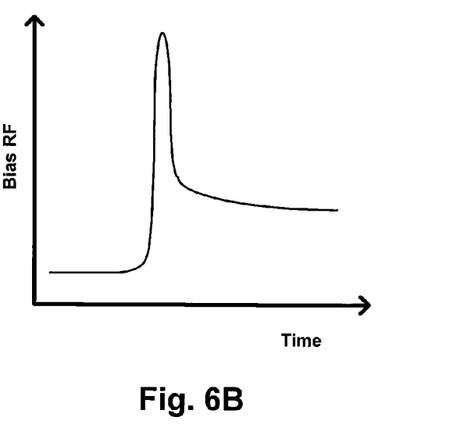

A number of other variations in the process regime may also be included. For example, block 432 of FIG. 4 notes that an electrical bias may be applied to the substrate. Application of a bias may increase the attraction of ions in the plasma to the substrate, thereby increasing the deposition rate and improving adhesion of the carbon film to the substrate. It was previously noted, however, that there is an increased risk of incorporating carbon into the substrate if the bias is too high. Thus, while some embodiments make use of a constant bias applied to the substrate as illustrated in FIG. 6A, other embodiments make use of a varying bias. One suitable bias profile is illustrated in FIG. 6B. In embodiments that use this profile, an initial bias is provided at a level lower than the steady-state value; this provides some stability to the initial deposition of the film without significant risk of incorporating carbon. The bias is then increased after a protective portion of the film is deposited to a value that exceeds the steady-state value, acting to stabilize the film and improve the overall adhesion of the film. After a time period that is sufficiently short to avoid compromising the thermal budget of the process, the bias is reduced to the steady state value, where it may remain in some embodiments through the remainder of the film deposition. Suitable values for the steady-state bias value, in embodiments like that illustrated in FIG. 6A that have a substantially constant bias and in embodiments like that illustrated in FIG. 6B where the bias value changes over time, are between 0 and 5000 W.

In some embodiments, backside cooling of the substrate is used, as indicated at block 436 of FIG. 4. Such backside cooling is usually provided with a coolant flow of helium through structures that support the substrate within the processing chamber and may be used to compensate for other aspects of the process that tend to increase the temperature of the substrate. For example, the application of a higher bias to improve adhesion of the carbon film on the substrate may be realized by the use of backside cooling to prevent the substrate temperature from deviating outside the thermal-budget constraints. In other instances, the use of backside cooling may allow higher source powers to be used in forming the plasma. Such higher source powers may be particularly desirable in embodiments where the carbon precursor has double or triple bonds that require more energy to break in forming the plasma than the single bonds in other precursors.

Block 440 of FIG. 4 notes that a liner may be formed over the substrate in some embodiments. The use of a liner may serve at least two purposes: it provides a mechanism for protecting the substrate from plasma damage that adversely affects conductivity and it may improve the adhesion of the carbon film to the substrate. There are a number of techniques that may be used to form a liner in different embodiments. It is noted that while many embodiments may deposit the liner as a carbon liner, this is not a strict requirement of the invention and other compositions may be used for the liner. This is because a carbon film will subsequently be deposited over the liner at block 444 and provide the desired absorption of electromagnetic radiation. After deposition of the carbon film, the plasma is terminated at block 448 and the substrate is transferred out of the substrate processing chamber at block 452 for further processing.

Figure 7:
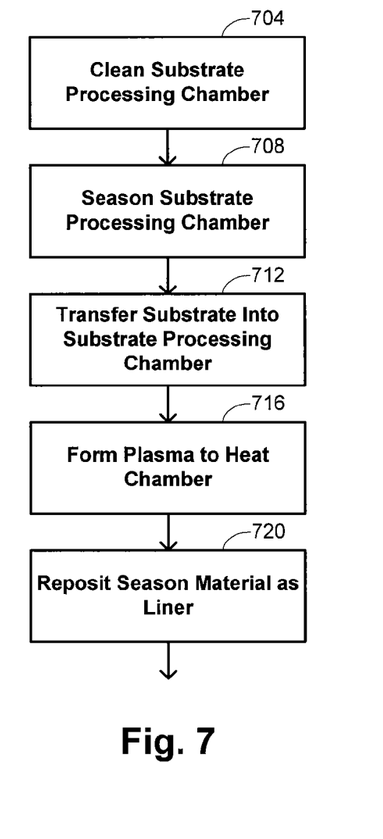
FIG. 7 is a flow diagram summarizing a first set of methods for depositing a liner as part of the methods of FIG. 4.

One method for depositing a liner is illustrated with the flow diagram of FIG. 7. This method makes use of a process-chamber seasoning that may occur before the transfer of the substrate into the processing chamber at block 408 of FIG. 4. After the chamber is cleaned at block 704, it is seasoned by forming a coating on the interior surfaces of the chamber at block 708. The coating may comprise carbon, nitrogen, or another element in different embodiments, depending on the desired composition of the liner. After the substrate is transferred into the substrate processing chamber at block 712 and a plasma is formed to heat the chamber at block 716, the seasoning material is redeposited on the substrate as a liner. The plasma formed at block 716 may correspond to the heat-up plasma formed at block 416 of FIG. 4 and have a composition like that described in connection with FIG. 4.

Figure 8:
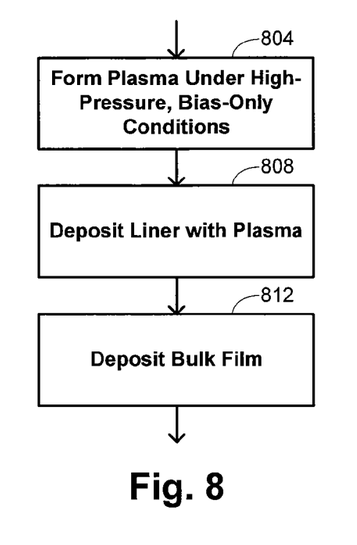
FIG. 8 is a flow diagram summarizing a second set of methods for depositing a liner as part of the methods of FIG. 4.

Another method for depositing a liner is illustrated with the flow diagram of FIG. 8. In this method, the initial deposition plasma is formed under high-pressure bias-only conditions, or by including only weak source power. These may define the plasma conditions that exist initially at block 428 of FIG. 4. A typical pressure for these conditions is between about 100 mtorr and 1 torr. At such pressure and with at best weak source power, the conditions in even an inductively coupled processing chamber resemble those in a typical capacitance-coupled processing chamber. That is, the density of the plasma is low so that the liner may be deposited at block 808 with better adhesion and less plasma damage. Deposition of the liner is then followed at block 812 with deposition of the bulk carbon film.

Figure 9:
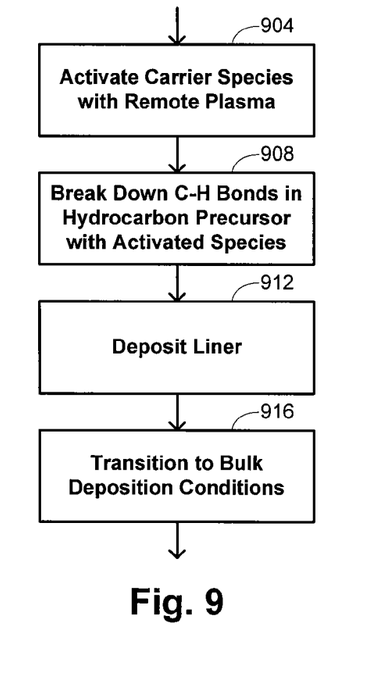
FIG. 9 is a flow diagram summarizing a third set of methods for depositing a liner as part of the methods of FIG. 4.

Still another method for depositing a liner is illustrated with the flow diagram of FIG. 9. Embodiments that use this method make use of a remote plasma system to activate the carrier species at block 904. The activated carrier species is used to break down bonds in the precursor at block 908 so that the liner is deposited at block 912 without direct exposure of the substrate to the plasma. A transition is made to bulk deposition conditions at block 916.

Exemplary Substrate Processing System

Figure 10A:
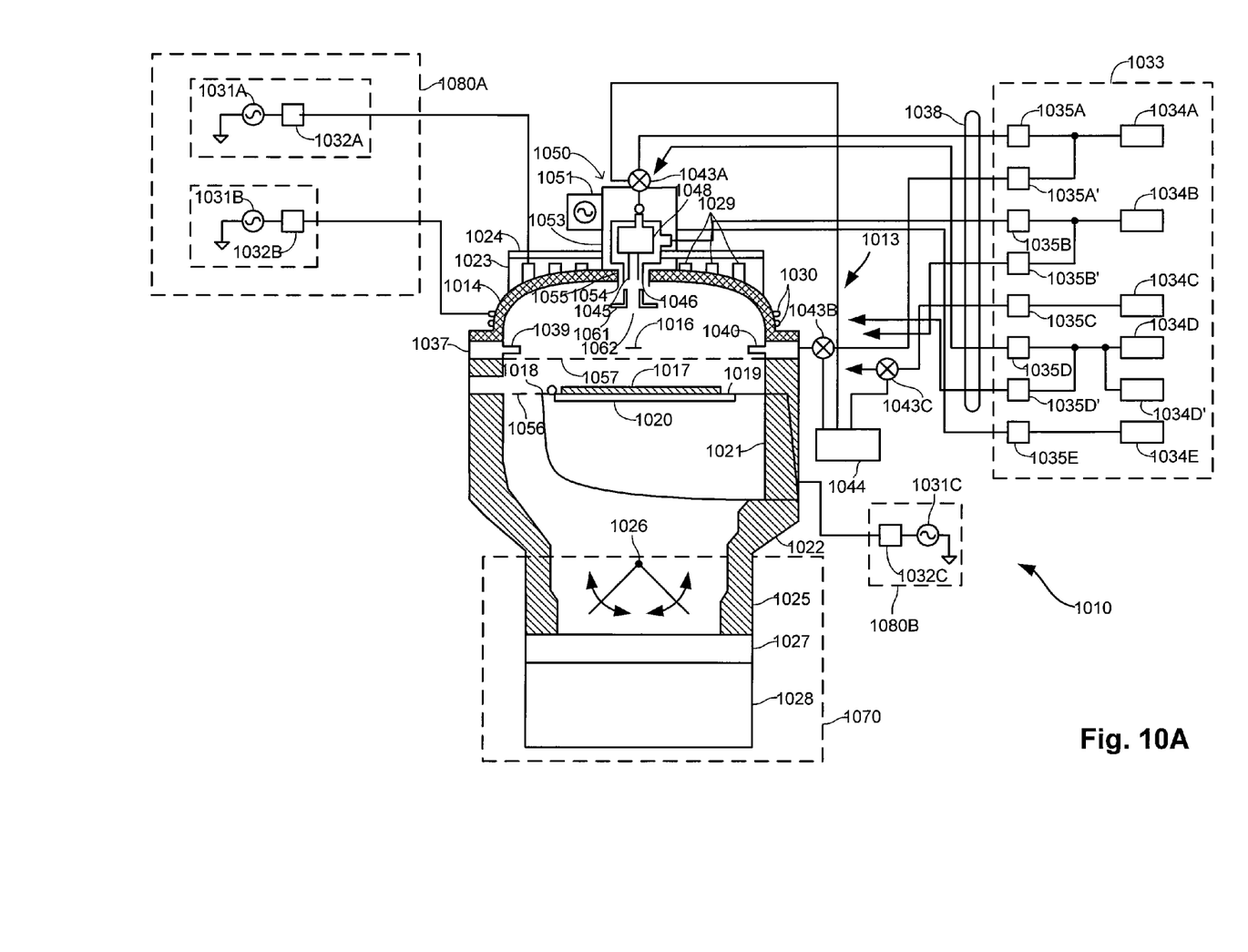
FIG. 10A is a simplified diagram of one embodiment of a high-density-plasma chemical-vapor-deposition system.

An example of a substrate-processing system within which embodiments of the invention may be implemented is the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 10A and 10B below. FIG. 10A schematically illustrates the structure of such an HDP-CVD system 1010 in one embodiment. The system 1010 includes a chamber 1013, a vacuum system 1070, a source plasma system 1080A, a bias plasma system 1080B, a gas delivery system 1033, and a remote plasma cleaning system 1050.

The upper portion of chamber 1013 includes a dome 1014, which is made of a ceramic dielectric material, such as aluminum oxide or aluminum nitride. Dome 1014 defines an upper boundary of a plasma processing region 1016. Plasma processing region 1016 is bounded on the bottom by the upper surface of a substrate 1017 and a substrate support member 1018.

A heater plate 1023 and a cold plate 1024 surmount, and are thermally coupled to, dome 1014. Heater plate 1023 and cold plate 1024 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 1013 includes a body member 1022, which joins the chamber to the vacuum system. A base portion 1021 of substrate support member 1018 is mounted on, and forms a continuous inner surface with, body member 1022. Substrates are transferred into and out of chamber 1013 by a robot blade (not shown) through an insertion/removal opening (not shown) in the side of chamber 1013. Lift pins (not shown) are raised and then lowered under the control of a motor (also not shown) to move the substrate from the robot blade at an upper loading position 1057 to a lower processing position 1056 in which the substrate is placed on a substrate receiving portion 1019 of substrate support member 1018. Substrate receiving portion 1019 includes an electrostatic chuck 1020 that secures the substrate to substrate support member 1018 during substrate processing. In a preferred embodiment, substrate support member 1018 is made from an aluminum oxide or aluminum ceramic material. Further details of the substrate support member in embodiments of the invention are provided below.

Vacuum system 1070 includes throttle body 1025, which houses twin-blade throttle valve 1026 and is attached to gate valve 1027 and turbo-molecular pump 1028. It should be noted that throttle body 1025 offers minimum obstruction to gas flow, and allows symmetric pumping. Gate valve 1027 can isolate pump 1028 from throttle body 1025, and can also control chamber pressure by restricting the exhaust flow capacity when throttle valve 1026 is fully open. The arrangement of the throttle valve, gate valve, and turbo-molecular pump allow accurate and stable control of chamber pressures up to about 1 millitorr to about 2 torr.

The source plasma system 1080A includes a top coil 1029 and side coil 1030, mounted on dome 1014. A symmetrical ground shield (not shown) reduces electrical coupling between the coils. Top coil 1029 is powered by top source RF (SRF) generator 1031A, whereas side coil 1030 is powered by side SRF generator 1031B, allowing independent power levels and frequencies of operation for each coil. This dual coil system allows control of the radial ion density in chamber 1013, thereby improving plasma uniformity. Side coil 1030 and top coil 1029 are typically inductively driven, which does not require a complimentary electrode. In embodiments of the invention, the side coil is included in a side-coil assembly having the characteristics discussed above. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 1080B includes a bias RF ("BRF") generator 1031C and a bias matching network 1032C. The bias plasma system 1080B capacitively couples substrate portion 1017 to body member 1022, which act as complimentary electrodes. The bias plasma system 1080B serves to enhance the transport of plasma species (e.g., ions) created by the source plasma system 1080A to the surface of the substrate.

RF generators 1031A and 1031B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 1032A and 1032B match the output impedance of generators 1031A and 1031B with their respective coils 1029 and 1030. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 10B:
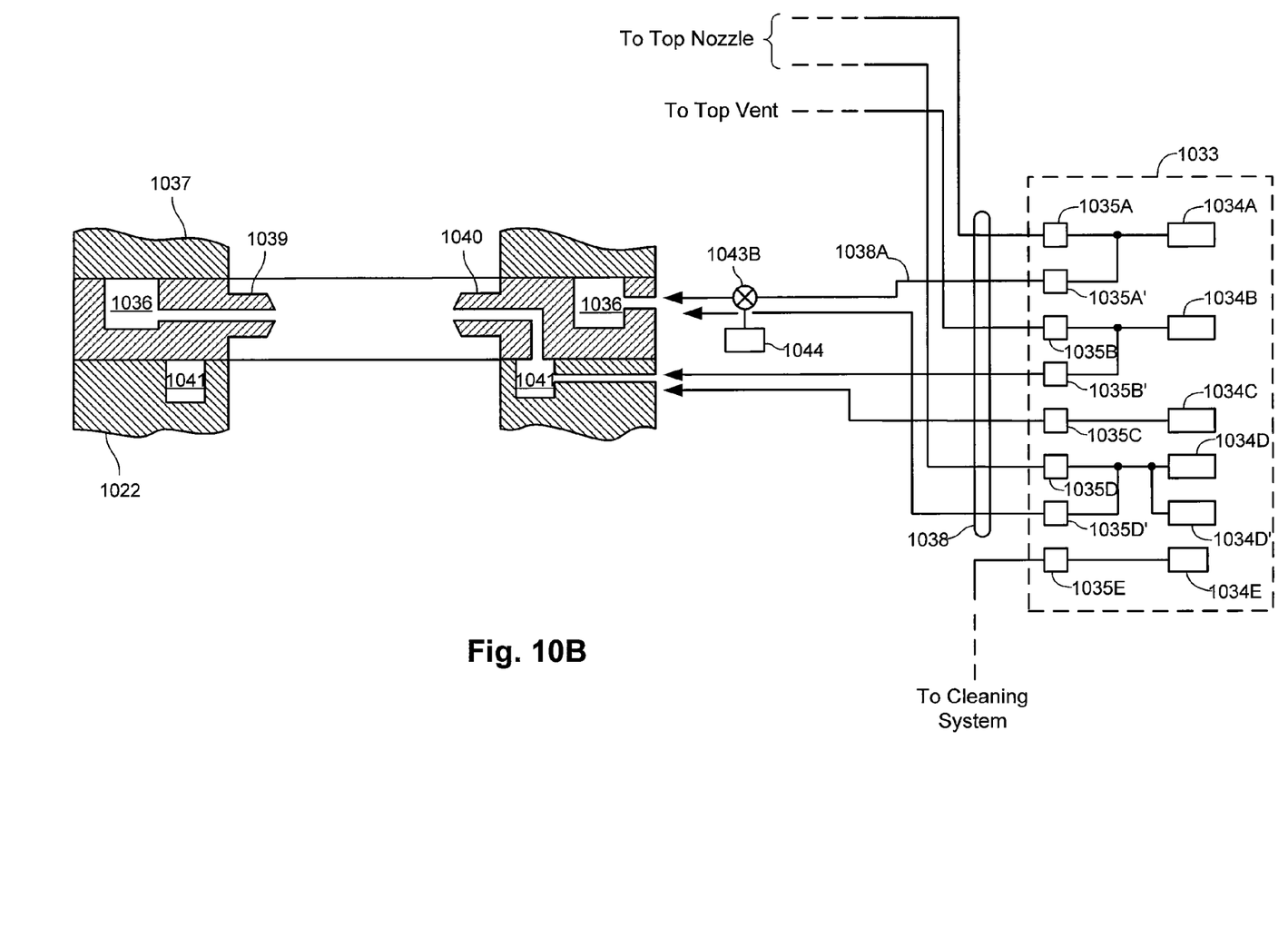
FIG. 10B is a simplified cross section of a gas ring that may be used in conjunction with the exemplary processing system of FIG. 12A.

A gas delivery system 1033 provides gases from several sources, 1034A-1034E chamber for processing the substrate via gas delivery lines 1038 (only some of which are shown). As would be understood by a person of skill in the art, the actual sources used for sources 1034A-1034E and the actual connection of delivery lines 1038 to chamber 1013 varies depending on the deposition and cleaning processes executed within chamber 1013. Gases are introduced into chamber 1013 through a gas ring 1037 and/or a top nozzle 1045. FIG. 10B is a simplified, partial cross-sectional view of chamber 1013 showing additional details of gas ring 1037.

In one embodiment, first and second gas sources, 1034A and 1034B, and first and second gas flow controllers, 1035A' and 1035B', provide gas to ring plenum 1036 in gas ring 1037 via gas delivery lines 1038 (only some of which are shown). Gas ring 1037 has a plurality of source gas nozzles 1039 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 1037 has 12 source gas nozzles made from an aluminum oxide ceramic.

Gas ring 1037 also has a plurality of oxidizer gas nozzles 1040 (only one of which is shown), which in a preferred embodiment are co-planar with and shorter than source gas nozzles 1039, and in one embodiment receive gas from body plenum 1041. In some embodiments it is desirable not to mix source gases and oxidizer gases before injecting the gases into chamber 1013. In other embodiments, oxidizer gas and source gas may be mixed prior to injecting the gases into chamber 1013 by providing apertures (not shown) between body plenum 1041 and gas ring plenum 1036. In one embodiment, third, fourth, and fifth gas sources, 1034C, 1034D, and 1034D', and third and fourth gas flow controllers, 1035C and 1035D', provide gas to body plenum via gas delivery lines 1038. Additional valves, such as 1043B (other valves not shown), may shut off gas from the flow controllers to the chamber. In implementing certain embodiments of the invention, source 1034A comprises a silane $SiH_4$ source, source 1034B comprises a molecular oxygen $O_2$ source, source 1034C comprises a silane $SiH_4$ source, source 1034D comprises a helium He source, and source 1034D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 1043B, to isolate chamber 1013 from delivery line 1038A and to vent delivery line 1038A to vacuum foreline 1044, for example. As shown in FIG. 10A, other similar valves, such as 1043A and 1043C, may be incorporated on other gas delivery lines. Such three-way valves may be placed as close to chamber 1013 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 10A, chamber 1013 also has top nozzle 1045 and top vent 1046. Top nozzle 1045 and top vent 1046 allow independent control of top and side flows of the gases, which improves film uniformity and allows fine adjustment of the film's deposition and doping parameters. Top vent 1046 is an annular opening around top nozzle 1045. In one embodiment, first gas source 1034A supplies source gas nozzles 1039 and top nozzle 1045. Source nozzle MFC 1035A' controls the amount of gas delivered to source gas nozzles 1039 and top nozzle MFC 1035A controls the amount of gas delivered to top gas nozzle 1045. Similarly, two MFCs 1035B and 1035B' may be used to control the flow of oxygen to both top vent 1046 and oxidizer gas nozzles 1040 from a single source of oxygen, such as source 1034B. In some embodiments, oxygen is not supplied to the chamber from any side nozzles. The gases supplied to top nozzle 1045 and top vent 1046 may be kept separate prior to flowing the gases into chamber 1013, or the gases may be mixed in top plenum 1048 before they flow into chamber 1013. Separate sources of the same gas may be used to supply various portions of the chamber.

A remote microwave-generated plasma cleaning system 1050 is provided to periodically clean deposition residues from chamber components. The cleaning system includes a remote microwave generator 1051 that creates a plasma from a cleaning gas source 1034E (e.g., molecular fluorine, nitrogen trifluoride, other fluorocarbons or equivalents) in reactor cavity 1053. The reactive species resulting from this plasma are conveyed to chamber 1013 through cleaning gas feed port 1054 via applicator tube 1055. The materials used to contain the cleaning plasma (e.g., cavity 1053 and applicator tube 1055) must be resistant to attack by the plasma. The distance between reactor cavity 1053 and feed port 1054 should be kept as short as practical, since the concentration of desirable plasma species may decline with distance from reactor cavity 1053. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 1020, do not need to be covered with a dummy wafer or otherwise protected, as may be required with an in situ plasma cleaning process. In FIG. 10A, the plasma-cleaning system 1050 is shown disposed above the chamber 1013, although other positions may alternatively be used.

A baffle 1061 may be provided proximate the top nozzle to direct flows of source gases supplied through the top nozzle into the chamber and to direct flows of remotely generated plasma. Source gases provided through top nozzle 1045 are directed through a central passage 1062 into the chamber, while remotely generated plasma species provided through the cleaning gas feed port 1054 are directed to the sides of the chamber 1013 by the baffle 1061.

EXAMPLES

An example of a specific recipe that may be used to deposit a carbon film in accordance with an embodiment of the invention is illustrated in Table I.

TABLE I

| Exemplary Recipe | | | | | | |
|---|---|---|---|---|---|---|
| | | | RF Power (W) | | Carrier Flow | $C_2H_4$ Flow |
| No. | Time (s) | TV | Source | Bias | (sccm) | (sccm) |
| 1 | 15.0 | Closed | 0 + 0 | 0 | 600 Ar | 0 |
| 2 | 1.0 | Closed | 0 + 4000 | 0 | 200 Ar | 0 |
| 3 | 2.0 | 15% Open | 2000 + 2000 | 0 | 200 Ar<br>100 + 100 He | 0 |
| 4 | 60.0 | Open | 4000 + 7000 | 0 | 100 Ar<br>0 + 250 He | 0 |
| 5 | 1.0 | Open | 10 + 10 | 0 | 0 + 250 He | 100 |
| 6 | 1.0 | Open | 10 + 10 | 0 | 0 + 500 He | 200 |
| 7 | 1.0 | Open | 10 + 10 | 600 | 0 + 500 He | 200 |
| 8 | 3.0 | Open | 2000 + 2000 | 500 | 0 + 500 He | 200 |
| 9 | 125.0 | Open | 3000 + 0 | 2400 | 0 + 200 He | 450 |
| 10 | 5.0 | Open | 2000 + 1000 | 0 | 50 Ar<br>200 + 80 He | 0 |
| 11 | 10.0 | Open | 2000 + 1000 | 0 | 50 Ar<br>200 + 80 He | 0 |

In this table, the first column refers to a step number in the recipe; the second column refers to a maximum time period over which that step takes place; the third column refers to the degree that the throttle valve 1026 is open; the fourth and fifth columns refer to the source and bias RF powers that are applied; the sixth column refers to the flow rate of carrier(s); and the last column refers to the flow rate of ethylene $C_2H_4$, which is used as the precursor in this example. Ethylene has a double bond between the two carbon atoms. In the case of the source RF power, two numbers are separated by a "+" sign: the first number refers to the side RF power supplied and the second number refers to the top RF power supplied. In a similar fashion, the He carrier flow is identified by two numbers that are also separated by a "+" sign, with the first number referring to the flow through side sources and the second number referring to the flow through top sources.

In this example, the processing chamber is pressurized after placement of the substrate with a closed throttle valve during step 1 and the plasma is struck during step 2. After opening the throttle valve during step 3, the substrate is subjected to a plasma heat-up during step 4. A flow of deposition gases is begun at step 5 and increased during step 6, with the deposition plasma being struck at step 7. Deposition of a liner takes place during step 8 and bulk deposition of the carbon film takes place during step 9. At steps 10 and 11, the bias is turned off and the substrate released.

Figure 11:
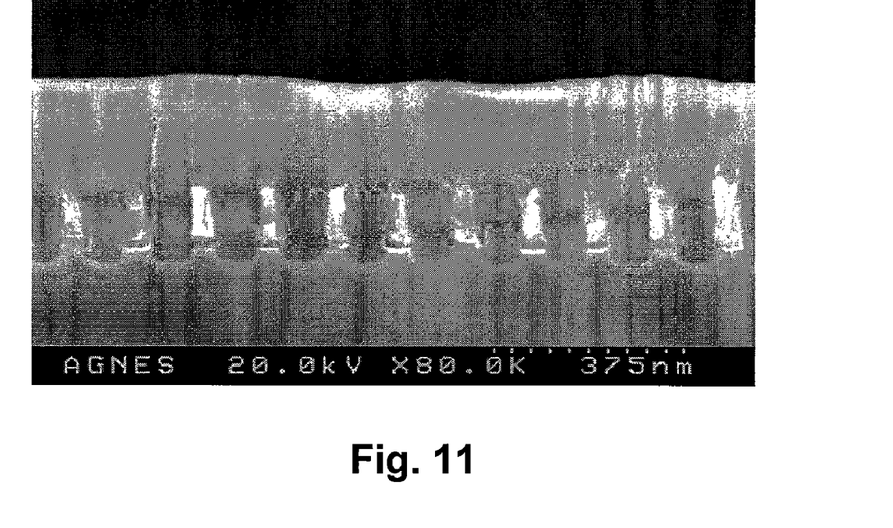
FIG. 11 is a scanning-electron-microscope image of a carbon film deposited over a substrate using the methods of the invention.

Carbon films deposited in accordance with embodiments of the invention demonstrate high extinction coefficients, i.e. with $k \geq 0.3$, making them suitable for exposure to electromagnetic radiation in annealing applications. In instances where the substrate comprises gaps formed between adjacent structures, the films also exhibit good gapfill properties with substantially void-free deposition. This is illustrated with the SEM photograph of FIG. 11, which shows an amorphous carbon film deposited over a 200-mm substrate using the methods described above. Optical tests of the deposited film confirm that it has an extinction coefficient greater than 0.3 at a wavelength of 633 nm.

Figure 12:
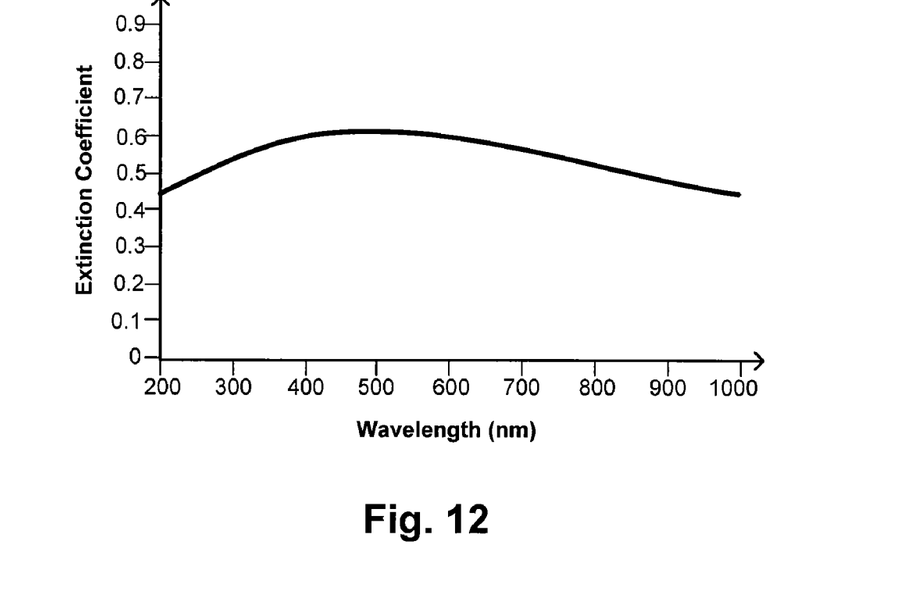
FIG. 12 provides measured results for the wavelength dependence of the extinction coefficient of a carbon film deposited using the methods of the invention.

Other tests have confirmed the ability of methods of the invention to achieve extinction coefficients greater than 0.3 over a wide range of wavelengths, as illustrated by the data provided in FIG. 12. The ability to produce films having extinction coefficients that are not only consistently high over wide wavelength ranges but also slowly varying over such wavelength ranges permits the application of broadband, narrowband, or substantially monochromatic light to be used in annealing applications.

Those of ordinary skill in the art will realize that specific parameters can vary for different processing chambers and different processing conditions, without departing from the spirit of the invention. Other variations will also be apparent to persons of skill in the art.

These equivalents and alternatives are intended to be included within the scope of the present invention. Therefore, the scope of this invention should not be limited to the embodiments described, but should instead be defined by the following claims.

What is claimed is:

1. A method of activating dopants in a doped semiconductor substrate, the method comprising:
preheating the doped semiconductor substrate to a pre-deposition temperature in the absence of a plasma in order to avoid exposing the substrate to a heating plasma whereby a decrease in the conductivity of the doped semiconductor substrate is avoided;
flowing a carbon precursor into a substrate processing chamber, wherein the preheated doped semiconductor substrate is disposed within the substrate processing chamber;
forming a plasma from the carbon precursor in the substrate processing chamber;
depositing a carbon film over the substrate with the plasma;
maintaining a temperature of the substrate while depositing the carbon film less than 500° C.; and
exposing the deposited carbon film to electromagnetic radiation for a period less than 10 ms, wherein the deposited carbon film has an extinction coefficient greater than 0.3 at a wavelength comprised by the electromagnetic radiation.

2. The method recited in claim 1 wherein the electromagnetic radiation is substantially monochromatic.

3. The method recited in claim 1 wherein:
the electromagnetic radiation comprises a band of wavelengths; and
the extinction coefficient of the carbon film is greater than 0.3 at each wavelength within the band of wavelengths.

4. The method recited in claim 1 wherein exposing the deposited carbon film to electromagnetic radiation comprises globally exposing substantially an entirety of a surface of the deposited carbon film to the electromagnetic radiation simultaneously.

5. The method recited in claim 1 wherein exposing the deposited carbon film to electromagnetic radiation comprises:
shaping a beam of the electromagnetic radiation into a shape; and
rastering the shape over a surface of the deposited carbon film to cover substantially an entirety of the surface.

6. The method recited in claim 1 wherein:
the carbon precursor comprises a hydrocarbon precursor; and
the deposited carbon film includes hydrogen.

7. The method recited in claim 1 further comprising flowing a nitrogen precursor into the substrate processing chamber with the carbon precursor, wherein:
forming the plasma comprises forming the plasma from the carbon precursor and from the nitrogen precursor; and
the deposited carbon film includes nitrogen.

8. The method recited in claim 1 further comprising flowing a carrier gas into the substrate processing chamber.

9. The method recited in claim 8 wherein the carrier gas is argon or molecular nitrogen.

10. The method recited in claim 1 wherein maintaining the temperature of the substrate comprises maintaining the temperature of the substrate while depositing the carbon film less than 400° C.

11. The method recited in claim 1 wherein maintaining the temperature of the substrate comprises flowing a coolant proximate a backside of the substrate within the substrate processing chamber.

12. The method recited in claim 1 wherein the preheating step comprises heating the doped semiconductor substrate outside the substrate processing chamber.

13. The method recited in claim 1 wherein the preheating step comprises exposing the doped semiconductor substrate to radiation from a lamp outside the substrate processing chamber.

14. The method recited in claim 1 wherein the preheating step comprises heating the doped semiconductor substrate with a heated electrostatic chuck inside the substrate chamber.

15. The method recited in claim 1 wherein the preheating step comprises heating the doped semiconductor substrate in the presence of a non-plasma heat-up gas selected from the group consisting of $N_2$, Ar, and a mixture of $N_2$ and Ar.

16. A method of activating dopants in a doped semiconductor substrate, the method comprising:
preheating the doped semiconductor substrate to a pre-deposition temperature in the absence of a plasma in order to avoid exposing the substrate to a heating plasma whereby a decrease in the conductivity of the doped semiconductor substrate is avoided;
flowing a carbon precursor into a substrate processing chamber, wherein the preheated doped semiconductor substrate is disposed within the substrate processing chamber;
forming a high-density plasma from the carbon precursor in the substrate processing chamber, wherein the high-density plasma has a density greater than $10^{11}$ ions/cm$^3$;
applying an electrical bias to the substrate;
depositing a carbon film over the substrate with the high-density plasma using a process that provides simultaneous deposition and sputtering components; and
exposing the deposited carbon film to electromagnetic radiation for a period less than 10 ms, wherein the deposited carbon film has an extinction coefficient greater than 0.3 at a wavelength comprised by the electromagnetic radiation.

17. The method recited in claim 16 wherein the electromagnetic radiation is substantially monochromatic.

18. The method recited in claim 16 wherein:
the electromagnetic radiation comprises a band of wavelengths; and
the extinction coefficient of the carbon film is greater than 0.3 at each wavelength within the band of wavelengths.

19. The method recited in claim 16 wherein exposing the deposited carbon film to electromagnetic radiation comprises globally exposing substantially an entirety of a surface of the deposited carbon film to the electromagnetic radiation simultaneously.

20. The method recited in claim 16 wherein exposing the deposited carbon film to electromagnetic radiation comprises:
shaping a beam of the electromagnetic radiation into a shape; and
rastering the shape over a surface of the deposited carbon film to cover substantially an entirety of the surface.

21. The method recited in claim 16 wherein:
the carbon precursor comprises a hydrocarbon precursor; and
the deposited carbon film includes hydrogen.

22. The method recited in claim 16 further comprising flowing a carrier gas into the substrate processing chamber.

23. The method recited in claim 16 wherein applying the electrical bias to the substrate comprises applying a substantially constant electrical bias to the substrate while depositing the carbon film over the substrate.

24. A method of activating dopants in a doped semiconductor substrate, the method comprising:
- preheating the doped semiconductor substrate to a pre-deposition temperature in the absence of a plasma in order to avoid exposing the substrate to a heating plasma whereby a decrease in the conductivity of the doped semiconductor substrate is avoided;
- flowing a hydrocarbon precursor into a substrate processing chamber, wherein the preheated doped semiconductor substrate is disposed within the substrate processing chamber;
- flowing a carrier gas into the substrate processing chamber
- forming a high-density plasma from the hydrocarbon precursor and the carrier gas in the substrate processing chamber, wherein the high-density plasma has a density greater than $10^{11}$ ions/cm$^3$;
- applying an electrical bias to the substrate;
- depositing a carbon film over the substrate with the high-density plasma using a process that provides simultaneous deposition and sputtering components;
- maintaining a temperature of the substrate while depositing the carbon film less than 400° C. by flowing a coolant proximate a backside of the substrate while depositing the carbon film;
- exposing the deposited carbon film to electromagnetic radiation for a period less than 10 ms, wherein the deposited carbon film has an extinction coefficient greater than 0.3 at a wavelength comprised by the electromagnetic radiation; and
- removing the deposited carbon film from the substrate by exposing the substrate to an oxygen plasma.

* * * * *